United States Patent
Nygaard, Jr. et al.

(10) Patent No.: US 6,668,235 B2
(45) Date of Patent: Dec. 23, 2003

(54) IDENTIFICATION OF CHANNELS AND ASSOCIATED SIGNAL INFORMATION CONTRIBUTING TO A PORTION OF A COMPOSITE EYE DIAGRAM

(75) Inventors: Richard A Nygaard, Jr., Colorado Springs, CO (US); Jeffrey John Haeffele, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 119 days.

(21) Appl. No.: 10/109,282

(22) Filed: Mar. 28, 2002

(65) Prior Publication Data

US 2003/0187620 A1 Oct. 2, 2003

(51) Int. Cl.$^7$ .............................................. G01R 13/00
(52) U.S. Cl. ......................... 702/73; 345/208; 708/819
(58) Field of Search .......................... 702/57, 64, 65, 702/66, 67, 69–73, 79, 117; 324/121 R, 158.1; 345/208, 418, 419, 440, 426; 382/275; 398/147

(56) References Cited

U.S. PATENT DOCUMENTS 5,210,712 A * 5/1993 Saito ........................... 708/819
5,999,163 A * 12/1999 Ivers et al. ................... 345/208

* cited by examiner

Primary Examiner—John Barlow
Assistant Examiner—John Le
(74) Attorney, Agent, or Firm—Edward L. Miller

(57) ABSTRACT

An eye diagram analyzer can assign a plurality of SUT data signals to be members of a labeled group of channels. There may be a plurality of such groups. The measured data for components within a group can be merged according to various different modes into a composite eye diagram presentation. When a composite eye diagram is being displayed, the operator may position a screen pointer (cursor) over some interesting part of the eye diagram, and the analyzer will display a list those channels that contributed to the displayed pixels in that part of the eye diagram, as well as other related information. The operator may also select a channel from among the group, and then have the displayed pixels for which it is responsible be displayed in a selected color or otherwise highlighted in a way that allows them to be distinguished from all others.

4 Claims, 6 Drawing Sheets

CHANNEL NINE BECOMES A SUSPECT

IDENTIFICATION OF CHANNELS AND ASSOCIATED SIGNAL INFORMATION CONTRIBUTING TO A PORTION OF A COMPOSITE EYE DIAGRAM

REFERENCE TO RELATED APPLICATION

The subject matter of the present Application pertains to the measurement of eye diagrams in general, and is especially well suited for one eye diagram measurement technique in particular, which technique is also usable in a logic analyzer adapted to perform eye diagram measurements, or in a stand-alone circuit within an item of separate test equipment intended for that purpose. And although we disclose herein the nature and the general principles of that technique in sufficient detail to allow a complete understanding of the invention, a tangible implementation of that technique has complexity beyond what is easily summarized and is capable of performing additional functions. A preferred implementation of that technique is the subject matter of a U.S. Patent Application entitled METHOD AND APPARATUS FOR PERFORMING EYE DIAGRAM MEASUREMENTS bearing Ser. No. 10/020,673 which was filed on Oct. 29, 2001 by Richard A. Nygaard, Jr. and assigned to Agilent Technologies, Inc. Because the subject matter of that Application is thus of interest to that of the present invention, and for the sake of brevity, "METHOD AND APPARATUS FOR PERFORMING EYE DIAGRAM MEASUREMENTS" is hereby expressly incorporated herein by reference.

The subject matter of this present Application is also related to that of a U.S. Patent Application entitled COMPOSITE EYE DIAGRAMS, filed on Jan. 31, 2002 by Richard A. Nygaard, Jr. and Jeffery J. Haeffele, and assigned to Agilent Technologies, Inc. The present Application deals with a way of using or of interpreting composite eye diagrams, once such eye diagrams are available. "COMPOSITE EYE DIAGRAMS" deals with how such eye diagrams may be obtained, and thus for the sake of brevity is also hereby expressly incorporated herein by reference.

BACKGROUND OF THE INVENTION

Eye diagrams are a conventional format for representing parametric information about signals, and especially digital signals. We shall refer to an item of test equipment or a measurement circuit arrangement that creates an eye diagram as an eye diagram tester, whether it is found in an oscilloscope, a BERT (Bit Error Rate Tester), a logic analyzer, or, as a separate item of test equipment. The preferred method (and by implication, any corresponding circuit apparatus) to be disclosed herein is that of the incorporated Application, is different than those used in 'scopes and BERTs, and is especially suitable for use within a logic analyzer, as well as an item of stand-alone test equipment. We shall call this different method (and any corresponding circuit apparatus) an Eye Diagram Analyzer, or EDA for short.

A modern eye diagram for a digital signal is not so much a trace formed continuously in the time domain, as it is an "eye" shape composed of closely spaced points (displayed dots, or illuminated pixels) representing many individual measurement samples taken upon separate instances of a signal occurring on a channel of interest, and which were then stored in a memory. Each measurement sample contributes to a displayed dot. The eye shape appears continuous because the collection of dots is rather dense, owing to the large number of times that the signal is sampled. Unlike a true continuous technique, however, there may be detached dots that are separated from the main body of the eye shape. A further difference with the continuous analog technique is that rare or infrequently occurring events, once sampled, do not appear faint in the display or disappear with the persistence of the CRT's phosphor. This latter difference is often quite an advantage, since it is often the case that such otherwise "hard to see" features of the trace are very much of interest.

In any event, the vertical axis is voltage, and the horizontal axis represents the differences in time (i.e., various offsets) between some reference event and the locations for the measurement samples. The reference event is generally an edge of a clock signal in the system under test, represents directly or through some fixed delay the expected point in time when the value of an applied data signal would be captured by some receiving circuit in an SUT (System Under Test), and is derived from an application of the SUT's clock to the Eye Diagram Analyzer. The time axis will generally have enough length to depict one complete eye-shape (cycle of a DUT signal) centered about the reference, with sometimes perhaps several additional eyes (cycles) before and after.

Different (X, Y) regions of an eye diagram represent different combinations of time and voltage. Assume that the eye diagram is composed of a number of pixels, and temporarily assume that the resolution is such that each different (X, Y) pixel position can represent a different combination of time and voltage (and vice versa), which combinations of time and voltage we shall term "measurement points." What the analyzer measures is the number of times, out of a counted number of clock cycles, that the signal on the channel being monitored passed through a selected measurement point. Then another measurement point is selected, and the process repeated until there are enough measurement points for all the pixels needed for the display. The range over which the measurement points are varied is called a "sample space" and is defined during a measurement set-up operation. And in reality, we define the sample space and the resolution for neighboring measurement points first, start the measurement and then let the analyzer figure out later how to ascribe values to the pixels of the display. The "display" is, of course, an arbitrary graphic output device such as a printer or an X Window of some as yet unknown size in a window manager (e.g., X11) for a computer operating system. (A one-to-one correspondence between display pixels and measurement points is not required. It will be appreciated that it is conventional for display systems, such as X Windows, to figure out how to ascribe values to the pixels for an image when the correspondence between the display's pixel locations and the image description is not one-to-one.)

An eye diagram trace itself is not a single time domain waveform (think: 'single valued function'), but is instead equivalent to an accumulation of many such instances; it can present multiple voltage (Y axis) values for a given time value (X axis). So, for example, the upper left-hand region of an eye might represent the combination of an adequate logical one at an adequately early time relative to the SUT's clock signal, and an eye diagram whose trace passes robustly through that region indicates to us that a signal of interest is generally achieving a proper onset of voltage at a proper time. Furthermore, we note that there are also other regions, say, near the center of an eye, that are not ordinarily transited by the trace, and which if that were indeed to happen, would presumably be an indication of trouble. Thickening of the traces is indicative of jitter, a rounding of a corner is indicative of slow transitions, and so on. An eye diagram by itself cannot reveal in the time domain which isolated instance of the signal caused such an exception, as other types of measurements might, but it does provide timely and valid information about signal integrity within a system as it operates. In particular, by incorporating very long (perhaps "infinite") persistence the eye diagram presents readily seen evidence of occasional or infrequently occurring failures.

An eye diagram, then, is information about signal behavior over time at various time-voltage (X, Y) combinations. A simple system would be to indicate that the signal was "there" or that it wasn't. That is, respectively put either an illuminated pixel or a non-illuminated pixel at the various (X, Y) locations for the different instances of "there." This is similar to what an analog oscilloscope would do if it were used to create an eye diagram for some signal. However, in such an analog case we would notice that some parts of the trace were brighter than others, and understand that this is a (somewhat useful) artifact caused by finite persistence on the one hand (old stuff goes away) and relative rates of occurrence on the other. That is, the display ends up having an intensity component at each pixel location. This is fine as far as it goes, but we would rather not rely upon the persistence of phosphor for this effect, since the most interesting indications are apt to be also the faintest. Since we are not using an analog 'scope, anyway, and have an instrument (an EDA) with memory (akin to a digital oscilloscope, timing analyzer or logic analyzer), we can gather data and decide after the fact what pixel value is to go with each (X, Y) pixel location. Those pixel values can be rendered as variations in color, intensity, or both, according to whatever scheme is in use (and there are several). The general idea is that the operator configures the EDA to render the display in a way that makes the condition he is most interested is quite visible, and also such that the eye diagram as a whole is generally easy to interpret. Thus, the reader is reminded that there is usually more going on than simply the presence or absence of dots at some series of (X, Y) locations, and that we often have recourse to the notion of a "pixel value" at some (X, Y) position in the display. We shall denote with the symbol "V" whatever that "pixel value" is. V might be a single binary-valued item, such as "ON" or "OFF" or it might be a variable intensity without the notion of color. On the other hand, V will often expand into a whole series of parameters $V_R, V_G, V_B, \ldots$, where each such parameter represents the intensity of an associated color. Whatever V is or represents, each $V_i$ is computed by the Eye Diagram Analyzer according to operational modes selected by the operator and in response to events measured in the System Under Test. In any event, we shall simply write $(X, Y, V)_i$ or perhaps $(X_i, Y_i, V_i)$, depending upon which notation seems to work best for our needs at the time, and not bother to indicate any associated further expansion of a $V_i$ into its component parameters, such as $(V_R, V_G, V_B)$.

It is often the case that the utility of an eye diagram is needed for characterizing or discovering circumstances that are both erroneous and very occasional. It is also the case that some SUTs have a great many channels that are subject to investigation. Some busses have hundreds of member signals, for example. When faced with such circumstances, the "luxury" of having one individual eye diagram trace per SUT signal becomes an oppressive burden. We might measure it that way, and we can indeed display it that way (with four or maybe eight channels at a time), but we likely will have lost all patience and become disgusted with the whole process before we complete looking at twenty-five or more sets of four or more traces each. Surely that is the wrong way to go about analyzing the data! But on the other hand, automating the investigation may be risky. Masking measurements, for example, essentially require that we formally decide ahead of time what is not of interest. The analyzer can apply the mask for us automatically and at great speed, but we will never know for sure that there was not some irregularity in there that met the mask criteria, and yet that would have been of interest to us anyway, if we had only seen it.

Accordingly, another tool has emerged to assist in eye diagram analysis for situations involving many channels. It is to merge into one combined eye diagram presentation the data of separate "component" eye diagram measurements for a useful grouping of related signals. The operator can instruct the EDA to merge the data of individual eye diagrams for a specified plurality (family) of signals into one combined eye diagram by arithmetically combining the numerical values for the sampled component data. Note that this does not involve any notion of adjusting vertical position for separately displayed component eye diagrams to get them to "stack up"! So now we have a combined eye diagram that probably has fat traces (indicating that, as expected, not all signals have simultaneous and identical rise times, voltage levels, etc.). Independent of that, we now expect that, having merged everything together, if there is something unusual going on, even if only occasionally for just one channel, we will, in principle, be able to see it.

We shall term such a combined eye diagram, created from the merging of data for individual component eye diagrams, a "composite" eye diagram.

The particular eye diagram analyzer described in the incorporated Application "COMPOSITE EYE DIAGRAMS" can assign a plurality of SUT data signals to be members of a labeled group of channels. There may be a plurality of such groups. In addition to mere superposition in an (X, Y) display space of the various i-many (X, Y)-valued pixels for individual component eye diagrams associated with that group, other measured data for those pixels within a group can be merged in any of various different modes to produce corresponding composite eye diagram presentations. In general, the rule for combining components to obtain a composite will produce a series of $(X, Y, V)_i$, where the $V_i$ represent some sort of density. The $V_i$ are generally rendered with variations in intensity or color, or with some combination of both. The details of that would be tedious for achieving our purpose in this Application, and interested readers are referred to the incorporated "COMPOSITE EYE DIAGRAMS".

This merging of measurements in the displayed data of a composite eye diagram is fine as far as it goes. It greatly assists in discovering that there is some trouble in there, someplace. It allows us to cast a wide net, as it were. But the very property that give us confidence that "it's in there, someplace" also poses the dilemma of how to separately identify it when its "hiding in plain sight," so to speak. Say, at least one signal out of thirty-two was unable to drive its load. Presumably, there will be a visible indication of this situation in the shape of the composite eye diagram. But on account of which channel(s)?? We need a way to quickly and easily isolate the culprit and discover who it is. Fussing with the probes one signal at a time is almost never practical, and in some cases, is impossible (as when an entire bus is probed at once by a single multi-conductor connector).

Once we have a channel in mind (whether for a component or a composite), and are interested in a particular place within an eye diagram, it would also be useful if there were a way to discover what the relevant history of signal behavior for that channel is at that place in the eye diagram. That is, it would be desirable to discover the answers to such questions as: "How many times did it contribute to that part of the eye diagram? What are the exact times and voltages for that location? How many clock periods occurred during this measurement?"

Evidently, then, we are in need of some tools to assist in the understanding and analysis of eye diagrams, and especially of those that are presented as composites. What to do?

SUMMARY OF THE INVENTION

A composite eye diagram is one where the data for a group of several selected individual component eye diagram measurements are combined to produce a single presentation, whose displayed pixels typically represent some sort of density. In a system that produces and displays composite eye diagrams, the operator may position a screen pointer over some interesting part of the composite eye diagram, and the analyzer will display a list of those channels that contributed to the displayed pixels in that part of the eye diagram, as well as information in tabular form related to the behavior of those channels at that part of the eye diagram. The operator may subsequently, or at any other time, select a channel from among the group, and then have the displayed pixels for which that channel is responsible be displayed in a selected color or otherwise highlighted in a way that allows them to be distinguished from all others. So, for an unusual indication in a composite eye diagram the user can discover that channels 2, 5 and 8 are involved by pointing at that indication with the mouse pointer, and then by highlighting the individual traces for those channels, decide that activity for channels 2 and 8 is benign, but that the activity for channel 5 is non-conforming.

DESCRIPTION OF A PREFERRED EMBODIMENT

Figure 1:
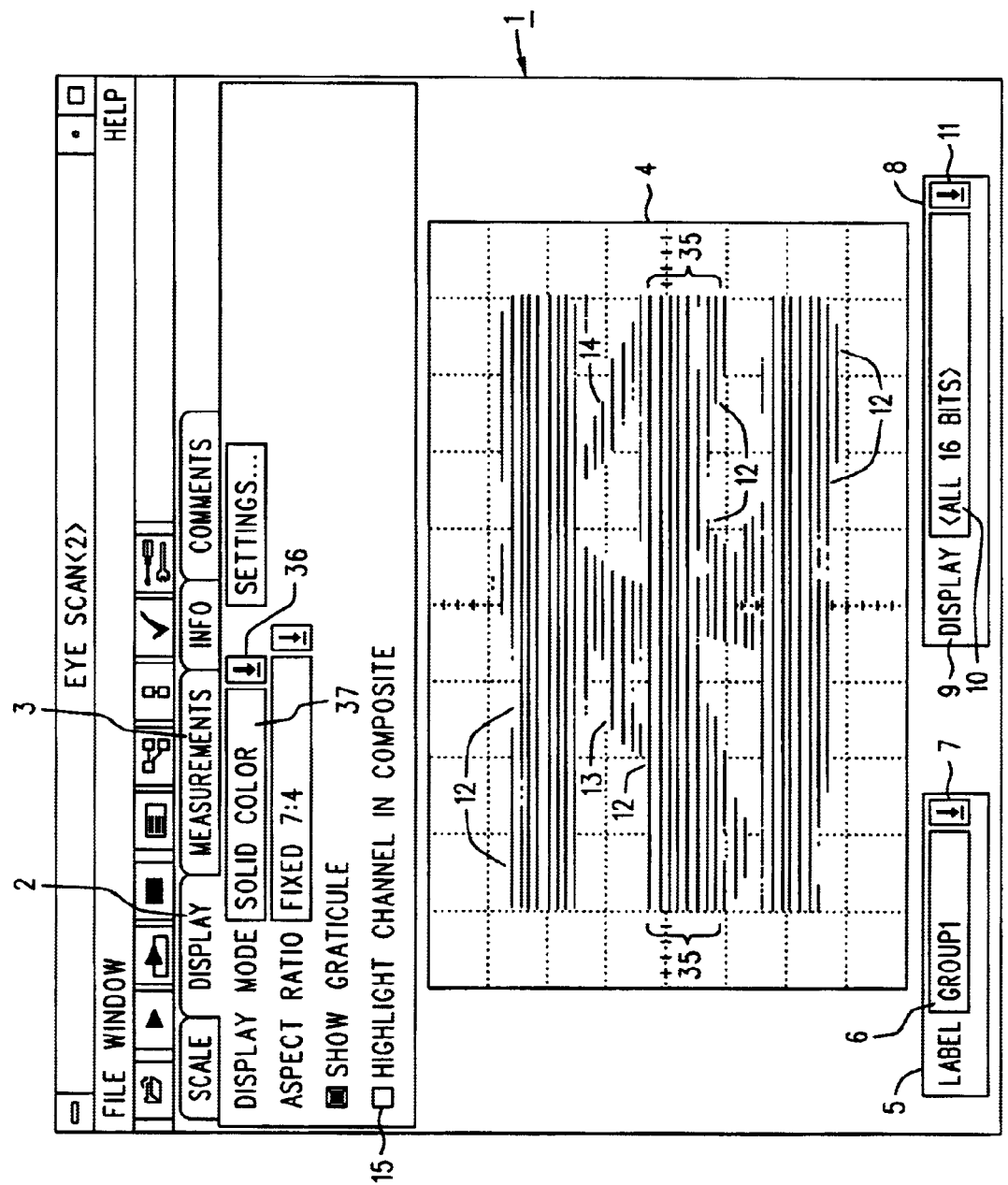
FIG. 1 is an example composite eye diagram measured and displayed by an eye diagram analyzer constructed in accordance with the invention, and wherein the composite eye diagram appears to contain at least one suspicious component.

Let us begin by considering how one might cope with a large collection of eye diagrams for the signals in a System Under Test, where "large" means significantly more than just a few eye diagrams. If there were just a few, then we could, of course, simply display each eye diagram; say, one above the other. But after about six or eight eye diagrams that solution becomes awkward, and it becomes increasingly impractical as the number of eye diagrams increases. If included in the same display, they become too small. We are apt to miss significant differences, and it takes a long time to make a careful comparison. It does not take much to persuade us that the composite eye diagram technique described in the incorporated "COMPOSITE EYE DIAGRAMS" is a useful first step in reducing the complexity of making sense out of the eye diagrams for fifty, one hundred, or even more than two hundred channels.

"COMPOSITE EYE DIAGRAMS" discloses using proper fractions as the value of a measurement point (therein called a 'measurement region') within the sample space of an eye diagram. The numerator of the fraction is the number of hits (instances where the signal passed through or sufficiently near the measurement point), while the denominator is the number of clock cycles for which the measurement took place. Typically, some visible cue concerning frequency of occurrence (the values of the proper fractions) is imparted to the displayed pixels forming the corresponding eye diagram, either using intensity or color, or some combination of each (the aforementioned $V_i$). This is attractive, since when each measurement point corresponds to a proper fraction (i.e., as a value between zero and one) it is easy to make that into, say, an intensity range of completely dark to fully on, or perhaps into a graded range of colors. But, if one measurement point was taken over several millions of clock cycles, and the corresponding measurement point for another signal was taken over just a few hundred, then it is clear that how we choose to combine the fractions has a lot to do with what the result means.

The incorporated "COMPOSITE EYE DIAGRAMS" describes several ways to combine the proper fractions that are the measured data. For example, one way to combine two measurement points p/m and q/n is to say that it ought to be (p+q)/(m+n). This is still a proper fraction, and it weights the manner of combination in favor of the measurement with the most history (larger denominator), and weights the contributions evenly if m and n are equal. This manner of eye diagram "addition" can be extended to any number of contributing eye diagrams, and is called the Normalized Signal Density Mode of merging eye diagrams. There are other modes, but the details for any of these modes are of interest only insofar as they produce composite eye diagrams. The interested reader can consult "COMPOSITE EYE DIAGRAMS" for their descriptions. The important idea underlying all this is that the data for each individual component eye diagrams resides in a respective associated separate data structure in memory, and the combined result data for the composite is placed in another instance of those same data structures. The rendered result is a composite eye diagram. It will be noted that there are other ways that a composite eye diagram can be produced. In any event, it is with a composite eye diagram in mind that we turn now to the subject matter of central interest, which deals with a collection of tools for assisting in the interpretation of eye diagrams, and which is especially useful for composite eye diagrams.

Refer now to FIG. 1, wherein is depicted an example composite eye diagram 12 measured and displayed by an eye diagram analyzer constructed in accordance with the invention. In particular, the example comprises a screen display 1 presented as a window by an operating system (e.g., UNIX or one of its variants, or perhaps one of the Microsoft products) and includes in box 4 an eye diagram 12, which in this case is a composite eye diagram for sixteen channels. The window with screen 1 is part of a GUI (Graphical User Interface) that serves as a "front panel" for the Eye Diagram Analyzer. It will be appreciated that a movable pointer symbol or icon moves within the display in response to movement or a mouse or other position input device, and that the shape (and thus the meaning) of the pointer symbol or icon changes in accordance with context, such as location within the screen and the (perhaps automatic) previous selection of certain operational modes. In this particular system the pointer symbol or icon is a small arrow when positioned over the various "controls" such as tabs and buttons, and when positioned over displayed data within box 4 is an axially aligned cross that is an appropriate suggestion of selection via the cross hairs in a reticle. Furthermore, it is well beyond the scope of the present disclosure to describe the entire user interface, and in the interest of brevity we shall restrict ourselves to just that portion that pertains to the subject matter of interest. The portions we are interested in are associated with a "Display" tab 2 and a "Measurements" tab 3. When the mouse (not shown) or other pointing device is moved so that the screen pointer (e.g., a small arrow, but which is not shown) is over a tab, and one of the mouse buttons is pressed (i.e., the familiar "clicking" operation common to window-based operating systems), a screen display specific to operations associated with that tab appears (i.e., that tab moves to be in front of all the other tabs). FIG. 1 shows just such a circumstance for having clicked upon the Display tab 2. The resulting screen 1 includes a related collection of controls on the tab (e.g., button 15). The balance of the screen display 1 continues to include box 4 containing the eye diagram 12, which in the case of our present example is a composite eye diagram, as well as some associated menu regions 5 and 8. The details of how a composite eye diagram measurement is performed are set out in the incorporated "COMPOSITE EYE DIAGRAMS".

A brief note is in order concerning the way we have depicted the eye diagram 12. In reality it is typically formed of a great number of adjacent pixels of varying intensities and colors, computed according to the rule in use for forming the composite. The effect might, for example, resemble that produced by color graded thermal imaging or a computer generated stress analysis. In any event, it does not directly lend itself to a patent drawing, so we have suppressed any graded variations in the basic composite in favor of a simple hatched region without gradation. Later on we will include contrasting hatching to depict specific highlighted regions, that might be, say, actually displayed with a different intensity or in a separate color. What is important is that the highlighted region within the overall eye diagram represents a selected highlighted component and a balance of the composite which are visually distinct from one another.

Briefly, the user activity involved in performing a composite eye diagram measurement (aside from the electrical connections) is a manipulation of the legends in menu regions 5 and 8, by using the menu production arrows 7 and 11, respectively, to expose menus and dialog boxes whose contents are then edited by an appropriate combination of screen pointer motion, clicking and keyboard input. The mechanics of this are conventional and are supported by the window manager in the operating system, while the semantic content and operational response are application specific and are provided by the application program being executed by the operating system, which in this case is an embedded eye diagram analyzer control program. Antecedent activity for the example of FIG. 1 amounts to defining (via a portion of the user interface that is not shown) a collection of sixteen channels as "Group1" (box 6) and specifying that the displayed composite eye diagram 12 is to be for all sixteen (box 10). The selection process for choosing the particular rule used to combine the proper fractions of the component eye diagrams for the sixteen channels of Group 1 is found under the Display Mode menu. (The menu production button 36 produces a list of selectable choices whose meanings are explained in documentation available to the operator. The legend "Solid Color" 37 is one such choice, and is associated with a "Signal Density" rule for adding component eye diagrams to form a composite eye diagram.) Furthermore, the absence of a "checked box" (15) or pressed button 15, in conjunction with the resulting legend "Display" 9, means that the composite eye diagram 12 for all sixteen channels (legend 10) is shown in an undifferentiated manner, which is to say, without highlighting any channel.

To continue, then, once the screen 1 is displayed and a composite eye diagram 12 is visible in box 4, the operator can observe the composite eye diagram and consider what it means. In the example of FIG. 1 it clearly means trouble; horizontal region 35 and regions 13 and 14 are anomalies that ought not to be there. One or more of the components of Group1 is sick. The question is "Which one?" Now, in this simple example of sixteen channels it would not be so bad to simply look at them each, one at a time, although it could become tiresome and it would be easy to miss significant differences between traces. The point is made by considering the case where there are one hundred and twenty eight, or more, channels. In any event, it is to the question "Which one(s)?" that we now turn.

Figure 2:
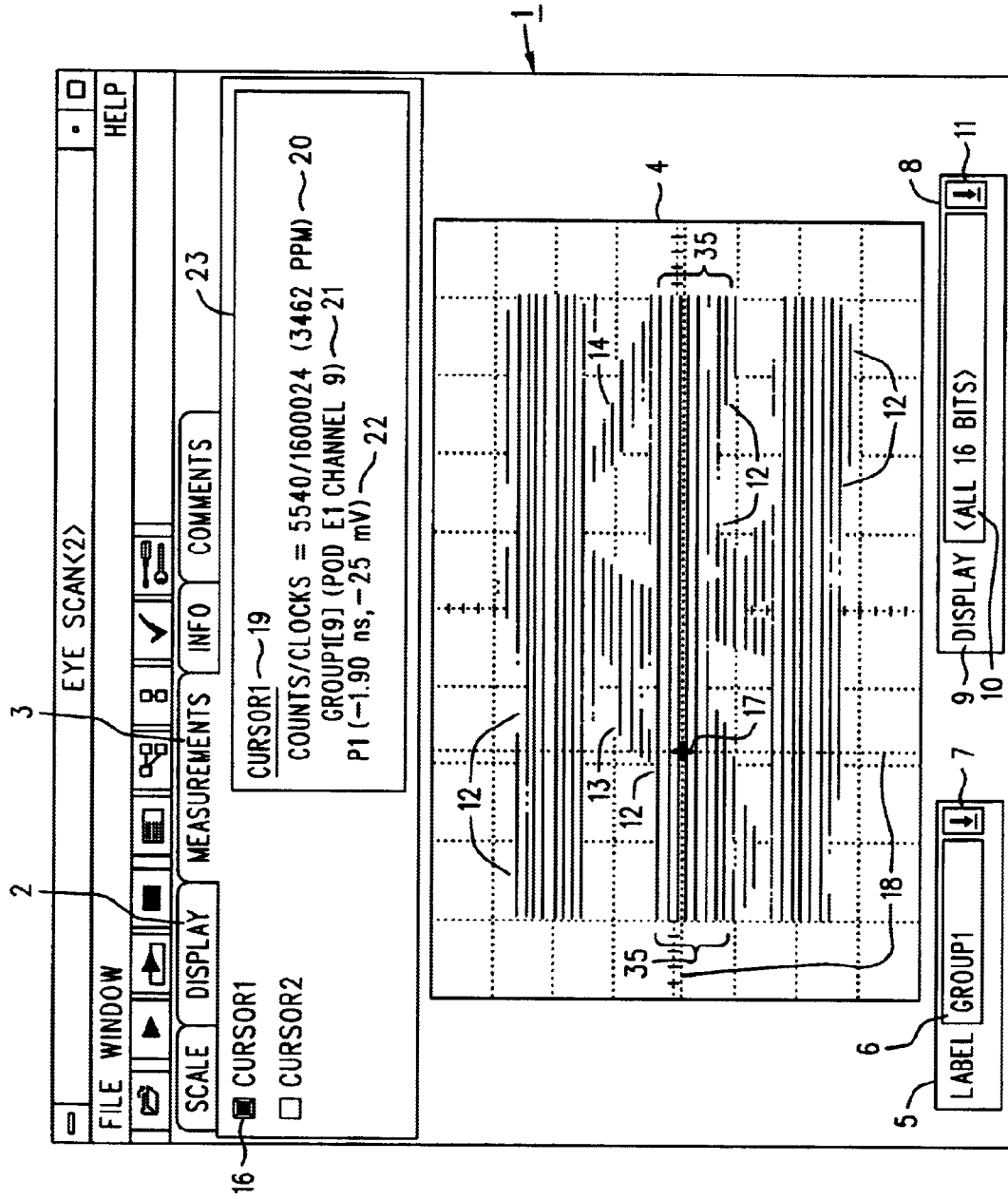
FIG. 2 is the example composite eye diagram of FIG. 1, and includes a tabular presentation of information related to those channels contributing to the composite eye diagram at a selectable and suspicious location indicated by a cursor controlled by a pointing device.

Refer now to FIG. 2, and note that the Measurements tab 3 has been selected. The Measurements tab 3 includes a button or check box 16 that enables or turns on a cursor called Cursor1. It consists of a small heavy cross 17 and axially aligned dotted lines 18, and moves according to motion of the mouse or other pointing device. (For example, when the screen pointer icon is positioned over the heavy cross 17, Cursor1 may be "clicked and dragged" via mouse motion to a new location. When the mouse button is released mouse motion once again moves the screen pointer icon. This is a well understood technique.) The idea is to position Cursor1 (17, 18) over a portion of composite eye diagram 12 that is of interest; in this case, some location within region 35. The Measurements tab 3 provides certain useful information in box 23 about the eye diagram 12, in part by indicating which channels visited the (time, voltage) location specified by Cursor1. More than one cursor can be positioned on the eye diagram 12, as selected by additional check boxes that are part of tab 3. In this case the example is sufficiently illustrated by using just one cursor, and only the "Cursor1" box 16 has been checked, leaving a second cursor unused.

Now consider the cursor dependent content of box 23. First, there is a legend 19 that serves as a heading for which cursor the information is for. In the present example only Cursor1 is active, so there is only one heading. If the second cursor (Cursor2) were active, then it would have its own heading (and related information) beneath the stuff for Cursor1, unless Cursor1 were not active, in which case only Cursor2 would have a heading. In any event, there are several types of information that can usefully be presented beneath the Cursor1 heading 19. These include a "counts/clocks=" entry 20, a listing 21 of channels whose data signals took on the values represented by the location of the cursor 17, and an indication 22 of what those values are. In the example of FIG. 2 we see that P1 (the location of Cursor1) is −1.9 nanoseconds and −25 millivolts. We learn from list 21 that only one channel passed through that location, and that it was channel [9] of Group1, which equates to an input labeled at the factory as channel 9 of probe pod E1. There is sufficient room in box 23 that listing 21 could have indicated that as many as two other channels also passed through P1, although in this example that did not happen. The line of information 20 tell us that there were a total of 1600024 clock cycles for the location P1 in the eye diagram 12 identified by Cursor1, that there were 5540 instances of (the channel) Group1 [9] that passed through or visited location P1, and that this amounts to 3462 parts per million.

Regions 35, 13 and 14 are relatively wide, and we understandably wonder if one bad channel will account for all that variation. Just as a reality check before proceeding further, we decide to position Cursor1 17 over a suspected good region. To that end, refer now to FIG. 3, which is an example similar to that of FIG. 2; the screen 1 and the eye diagram 12 it depicts are essentially the same as for FIG. 2. The difference is that Cursor1 is in a different location (a new P1, as identified by legend 26), and many more channels contributed activity at this different P1. In this example that greater number of channels is nine, individual listings of which would require more space than is provided for in box 23. There are various solutions to this, such as embedding a drop down list in the box 23, use of a scroll bar, etc., but a simple and useful response is to indicate what the number of channels is, once that number exceeds the available space. That is what has been done here with legend 25: "9 channels contributed". This is what we expect, since this is a "good spot" in the composite eye diagram 12, and we expect that many channels would visit it.

Figure 4:
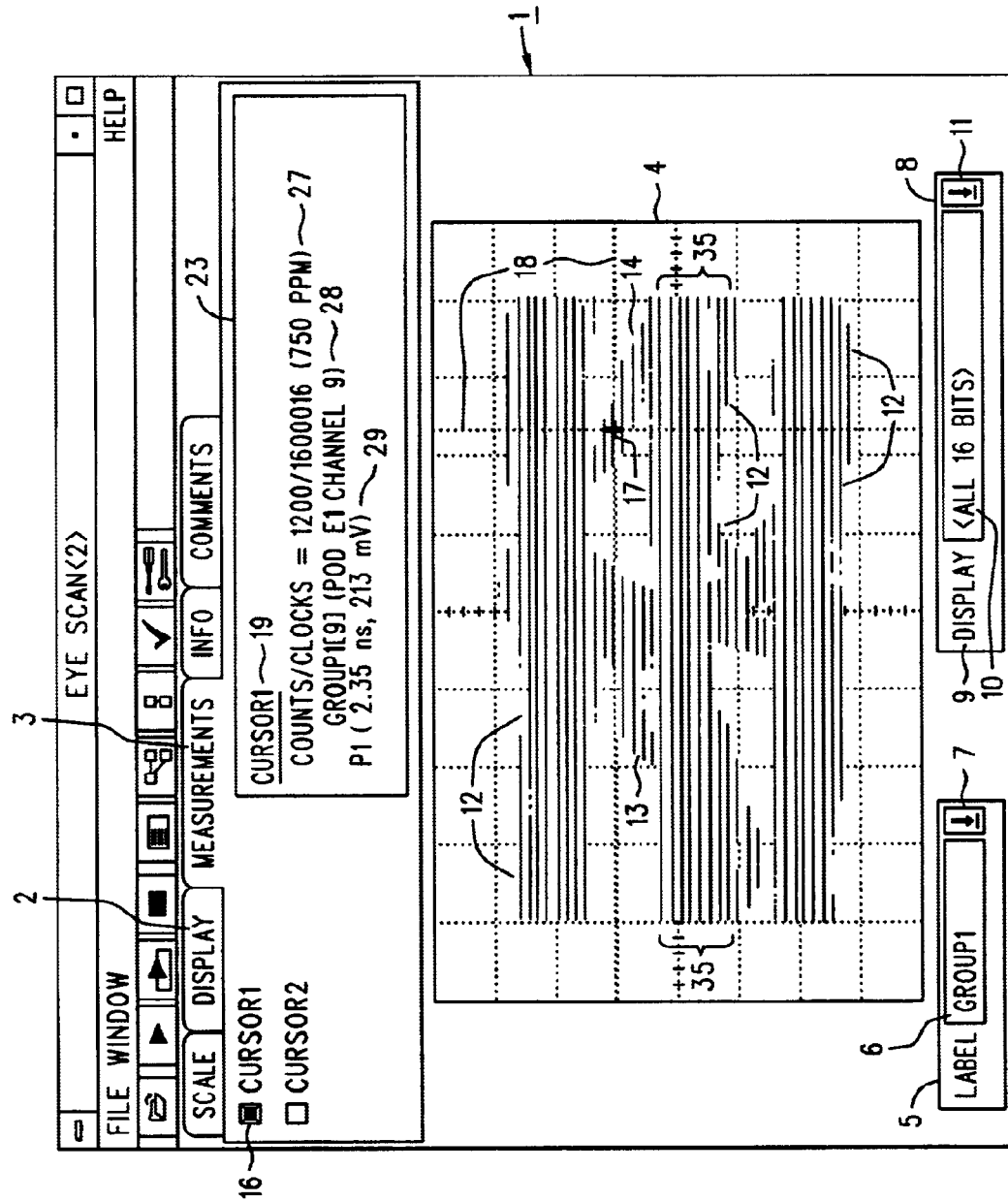
FIG. 4 is the example composite eye diagram of FIG. 2, with the cursor positioned over another suspicious location, and provides further evidence that the data signal for a particular suspect channel is operating incorrectly.

To continue with confirmation of our suspicions concerning channel nine, we position Cursor1 17 within region 14, which is an anomalous region of the trace (eye diagram). The result is as shown in FIG. 4. Note the content of box 23 once again points to channel nine as a malefactor. Now it is time to find out for sure.

Figure 5:
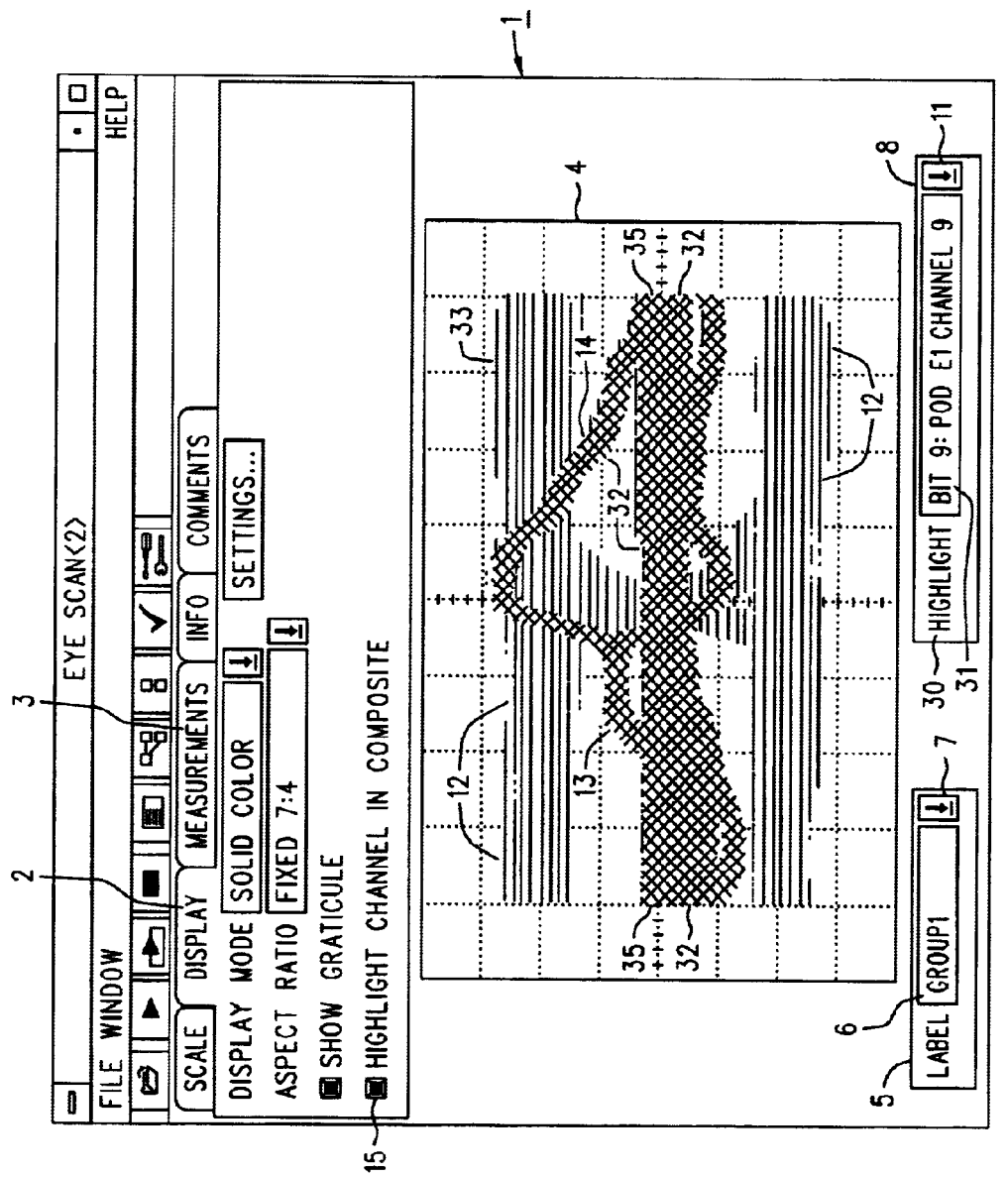
FIG. 5 is the example composite eye diagram of FIGS. 1 through 4 and includes a highlighted presentation of a selected channel of interest, which in this case is a suspicious channel that is shown to be malfunctioning.

Refer now to FIG. 5, where the operator has once again selected the Display tab 2, and in addition, has checked (or pushed the button at) box 15: "Highlight channel in composite". An accompanying result is that legend 30 in menu region 8 changed to "Highlight". Of course, we had to tell the EDA which channel to highlight, and that was done via the menu expansion button 11. When it was clicked upon a drop-down menu appeared allowing us to select which channel to highlight. We selected channel 9, as indicated by the legend 31.

Notice that the composite eye diagram 12 in box 4 is now supplemented with a highlighted portion 32 (indicated in the drawing by crosshatching, and most likely by coloring in an actual display) that is what a component eye diagram for channel nine, displayed in isolation, would look like. We see immediately that channel nine is indeed sick, and that its behavior accounts for the existence of anomalous regions 35, 13 and 14.

It occurs to us that there might be other malfunctioning channels for these anomalies besides channel nine, and that at we can find out if there are by returning to the Measurements tab 2 and positioning Cursor1 at various extremities and other locations of those anomalous regions, while watching to see if any channel besides channel nine is listed in box 23. Let us suppose that we have done that, and that there were not. So we can be fairly well satisfied that, as far as anomalous regions 35, 13 and 14 are concerned, the only culprit on the loose is channel nine. Still, there are other regions, such as 33, that are less than ideal, although perhaps still acceptable.

Figure 6:
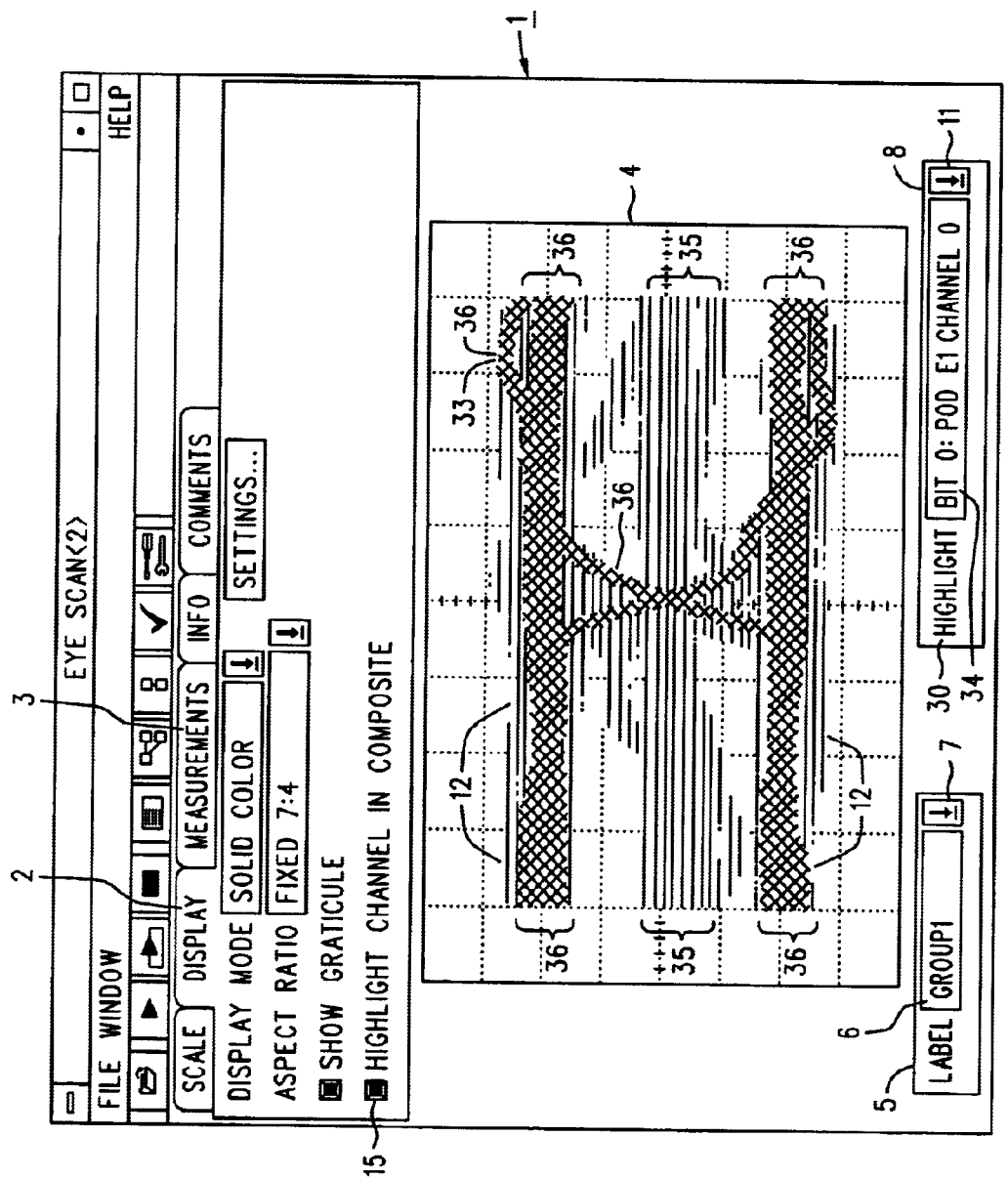
FIG. 6 is the example composite eye diagram of FIGS. 1 through 4 and includes a highlighted presentation of a selected channel of interest, which in this case is a channel that is shown to be functioning satisfactorily, but perhaps not perfectly.

Using the techniques we have described in connection with the Measurements tab 3 and the positioning of Cursor1 17, augmented by the descriptions appearing in box 23, we find that channel zero has activity at location 33. We decide to take a look by highlighting channel zero. See FIG. 6, which is similar to FIG. 5, except that it shows a highlighted component 36 corresponding to channel zero (see legend 34). We note that channel zero does indeed account for region 33 (of FIG. 5), and further decide that region 33 can be ignored.

What we now have available, then, is a tool to find out which channels contributed to some location of interest within an eye diagram, and especially for a composite eye diagram where individual channel identity does not persist into the eye diagram itself. So, the location of interest might be anywhere on an eye diagram, and would be associated with, say, a suspicious rise or fall, or an abnormally high or low voltage level. But by means of the tools described above, we can discover by positioning a cursor onto the location of interest within a composite eye diagram, which channel or channels are worthy of further investigation. It will be appreciated that a composite eye diagram is not required in box 4, and that if the eye diagram therein is a component (single channel) eye diagram, then the same types of information can still be presented in box 23, save that it will be for just that one channel. Once our suspicions have been aroused concerning a particular channel, we can highlight that channel within the composite eye diagram to see what it did, and also compare that to the behavior of the other channels in the group.

We turn now to a discussion of how these behaviors are implemented by the EDA. It will be recalled that the incorporated patents describe the existence of data structures that are used to hold the measured information needed to render component eye diagrams. In a sense, the EDA is pointed to a data structure and it displays the eye diagram described by that data structure. To create a composite eye diagram the data structures for the various components are read, their content combined according to an appropriate rule, and those results stored in another eye diagram data structure, which, when rendered by the EDA, produces the desired composite eye diagram. These data structures are essentially all the same, they differ only in their content. They are all indexed by time and voltage parameters that are varied by the EDA as it performs a measurement. They all store assorted kinds of result information that relate to how often the signal for a channel visited an indexed combination of time and voltage. The choice of whether there is one data structure per channel or one larger data structure that is also indexed by channel is a matter of preference.

Figure 3:
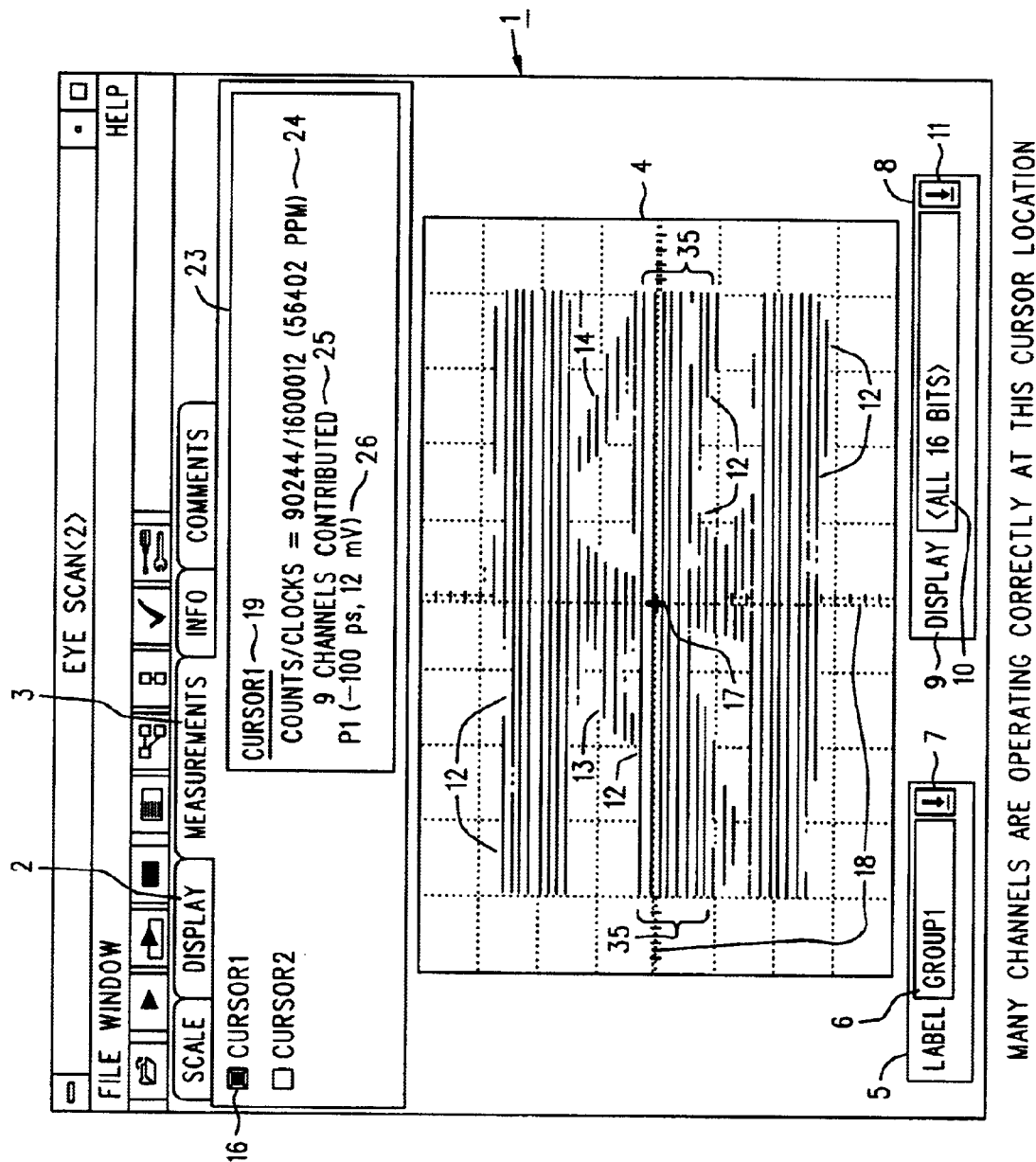
FIG. 3 is the example composite eye diagram of FIG. 2, but represents the case where the space allocated for the tabular presentation is insufficient for the number of contributing channels.

Given that there is an environment of data structures as described in the preceding paragraph, here is what is done to implement the "channel discovery" feature illustrated in FIGS. 2, 3 and 4. It will be recalled that this feature allows the operator to learn which channels contributed to a location on a composite eye diagram by positioning a cursor (Cursor1) over a selected location within the eye diagram, and noting the legends that result in a displayed region next to the eye diagram. There are two ways that this can be done. The first is to simply note the (time, voltage) pair represented by the location of the cursor and then apply that as an index to each data structure that is in the Group for (potential contributor to) the composite eye diagram. By inspecting the content of each data structure at the indexed location it can be determined which channels made a (non-zero) contribution to the eye diagram at that location. Those are the channels that need to be listed as contributors. If desired, their actual contribution can be included as part of the displayed legends.

A second way to implement the "channel discovery" feature is to maintain a look-up table indexed by (time, voltage) pairs and containing which channels produced non-zero contributions to their component eye diagrams as they are measured. The content of this look-up table can be as simple as a bit per channel, where a set bit indicates "contribution" without differentiating between greater and lesser amounts of channel visitation to the indexed (time, voltage) location. Of course, the rate of visitation (the proper fractions) could be stored instead, although increases in overhead and in memory are required. The advantage of this look-up table is in speed of performance during post-measurement investigation. New contributing channel information is available to be displayed as associated legends almost immediately as Cursor1 is moved around; it makes for a satisfying "snappy" system response.

Having discovered which channels are "of interest" (suspect?), we now wish to highlight a particular channel of the composite eye diagram. By the term "highlighting" we mean that some portion of the eye diagram (corresponding to a selected channel) is made quite visually distinct from the rest of it, but without being moved to a different location. There are, course, many ways in which this can be done, including changes in intensity, in color, or in both. Further choices include solid colors versus transparent overlays, and image portions that blink. The graphics community is well acquainted with these sorts of techniques and with how to render them as displayable screen images. In terms of the EDA architecture of data structures set out above, these types of results are produced through correctly adjusting the pixel values that are produced from the data content of an eye diagram data structure of interest, and are known processes and techniques. That said, we note that we must still initially do something to get a channel highlighted, and that there is more than one way to do it.

The first way is to take note of the channel selected to be highlighted, and then create and display a composite for all channels, including the selected channel. Then the selected channel is also created and "differently" displayed as if it were a stand-alone component eye diagram. "Differently" means in a visually distinct manner, as explained above. The two eye diagrams are displayed relative to the same (time, voltage) axes, and both are written to a frame buffer, so that the result is indeed a highlighting according to how the selected component is different (intensity, color, etc.).

The second way is like the first, except that the composite formed and displayed is for all channels except for the selected channel. That is, the selected channel is "subtracted out," as it were, from the composite. This is useful when there is one bad channel and the composite can be observed to "get better" when the suspect selected channel is separated out.

We claim:

1. A method of indicating which data signals contributed to a selected location within a composite eye diagram for a group of data signals, the method comprising the steps of:

(a) determining, for each data signal in the group, and at a collection of digital (time, voltage) pairs of which the time portion of each pair is an offset relative to a transition in a reference signal, the relative rate at which that data signal visits each (time, voltage) pair;

(b) for each data signal in the group, storing relative rate of visitation information determined in step (a) in a respective data structure indexed by the (time, voltage) pairs;

(c) for each data signal in the group, combining the respective stored relative rate of visitation information according to a rule to produce a single collection of such visitation information representing a composite eye diagram;

(d) displaying, relative to (time, voltage) coordinate axes associated with the determining in step (a), a composite eye diagram for the single collection of visitation information produced in step (c);

(e) positioning within the display of step (d), and in response to operator actuation of a screen pointer mechanism, a cursor at a selected location within the collection of (time, voltage) pairs;

(f) indexing the respective data structures of step (b) with the (time, voltage) coordinates of the selected location of step (e);

(g) subsequent to step (f), examining the relative rate of visitation information at the location in the data structures indexed by step (f) to discover which, if any, data signals visited that selected location; and (h) displaying legends indicating which, if any, of the data signals were discovered in step (g) to have visited the selected location.

2. A method of indicating which data signals contributed to a selected location within a composite eye diagram for a group of data signals, the method comprising the steps of:

(a) determining, for each data signal in the group, and at a collection of digital (time, voltage) pairs of which the time portion of each pair is an offset relative to a transition in a reference signal, the relative rate at which that data signal visits each (time, voltage) pair;

(b) for each data signal in the group, storing relative rate of visitation information determined in step (a) in respective first data structures indexed by the (time, voltage) pairs;

(c) for each data signal in the group that visits a (time, voltage) pair, storing in a second data structure indexed by the (time, voltage) pairs an indication that identifies which one, among of the group of data signals, the visiting data signal is;

(d) for each data signal in the group, combining the respective stored relative rate of visitation information according to a rule to produce a single collection of such visitation information representing a composite eye diagram;

(e) displaying, relative to (time, voltage) coordinate axes associated with the determining in step (a), a composite eye diagram for the single collection of visitation information produced in step (d);

(f) positioning within the display of step (e), and in response to operator actuation of a screen pointer mechanism, a cursor at a selected location within the collection of (time, voltage) pairs;

(g) indexing the respective data structures of step (c) with the (time, voltage) coordinates of the selected location of step (f);

(h) subsequent to step (g), examining the data signal visitation information at the location in the second data structure indexed by step (g) to discover which, if any, data signals visited that selected location; and (i) displaying legends indicating which, if any, of the data signals were discovered in step (h) to have visited the selected location.

3. A method of displaying a composite eye diagram for a group of component data signals, the method comprising the steps of:

(a) determining, for each component data signal in the group, and at a collection of digital (time, voltage) pairs of which the time portion of each pair is an offset relative to a transition in a reference signal, the relative rate at which that component data signal visits each (time, voltage) pair;

(b) for each component data signal in the group, storing relative rate of visitation information determined in step (a) in a respective data structure indexed by the (time, voltage) pairs;

(c) selecting one of the component data signals;

(d) for each component data signal in the group, including the selected component data signal, combining the respective stored relative rate of visitation information according to a rule to produce a single collection of such visitation information representing a composite eye diagram;

(e) displaying, relative to (time, voltage) coordinate axes associated with the determining in step (a), a composite eye diagram for the single collection of visitation information produced in step (d); and (f) superimposing, by displaying relative to the same (time, voltage) coordinate axes as used in step (e), a highlighted component eye diagram for the selected component data signal upon the composite eye diagram of step (e), the highlighting producing visual distinction between the composite and the selected component eye diagrams.

4. A method of displaying a composite eye diagram for a group of component data signals, the method comprising the steps of:

(a) determining, for each component data signal in the group, and at a collection of digital (time, voltage) pairs of which the time portion of each pair is an offset relative to a transition in a reference signal, the relative rate at which that component data signal visits each (time, voltage) pair;

(b) for each component data signal in the group, storing relative rate of visitation information determined in step (a) in a respective data structure indexed by the (time, voltage) pairs;

(c) selecting one of the component data signals;

(d) for each component data signal in the group, except the selected component data signal, combining the respective stored relative rate of visitation information according to a rule to produce a single collection of such visitation information representing a composite eye diagram;

(e) displaying, relative to (time, voltage) coordinate axes associated with the determining in step (a), a composite eye diagram for the single collection of visitation information produced in step (d); and (f) superimposing, by displaying relative to the same (time, voltage) coordinate axes as used in step (e), a highlighted component eye diagram for the selected component data signal upon the composite eye diagram of step (e), the highlighting producing visual distinction between the composite and the selected component eye diagrams.

* * * * *